(12) United States Patent
Yang

(10) Patent No.: US 6,410,418 B1
(45) Date of Patent: Jun. 25, 2002

(54) RECESS METALLIZATION VIA SELECTIVE INSULATOR FORMATION ON NUCLEATION/SEED LAYER

(75) Inventor: Kai Yang, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/639,796

(22) Filed: Aug. 17, 2000

Related U.S. Application Data (60) Provisional application No. 60/149,433, filed on Aug. 18, 1999.

(51) Int. Cl.⁷ .......................................... H01L 21/4763
(52) U.S. Cl. ................. 438/626; 438/633; 438/637; 438/641; 438/687
(58) Field of Search ............................. 438/625, 626, 438/633, 637, 638, 641, 643, 644, 645, 648, 687; 257/758

(56) References Cited

U.S. PATENT DOCUMENTS 5,897,368 A * 4/1999 Cole, Jr. et al.
6,001,420 A * 12/1999 Mosley et al.
6,077,780 A * 6/2000 Dubin
6,117,781 A * 9/2000 Lukanc et al.
6,136,707 A * 10/2000 Cohen
6,204,997 B1 * 3/2001 Sasaki

OTHER PUBLICATIONS

Stanley Wolf and Richard N. Tauber, "Silicon Processing for the VLSI Era—vol. 1: Process Technology," Lattice Press, Sunset Beach, California (1986), pp. 1, 5, 33.*

* cited by examiner

Primary Examiner—Keith Christianson
Assistant Examiner—Stephen W. Smoot

(57) ABSTRACT

The reliability of in-laid metallization patterns, e.g., of copper or copper alloy, is significantly enhanced by voidlessly filling recesses in a substrate by an electroplating process, wherein "pinching-off" of the recess opening due to formation of overhanging metal deposits as a result of increased rate of electrodeposition thereat is prevented. Embodiments include preliminarily selectively rendering the recess opening surface non-conductive. The inventive method also enables a reduction in electrodeposition over non-recessed areas, thereby reducing the time required for planarization, as by CMP.

18 Claims, 5 Drawing Sheets

FIG. 1
PRIOR ART

↓ ELECTROPLATE Cu

↓ CMP Cu

RECESS METALLIZATION VIA SELECTIVE INSULATOR FORMATION ON NUCLEATION/SEED LAYER

RELATED APPLICATION

This application claims priority from U.S. Provisional Application No. 60/149,433, filed Aug. 18, 1999, which is incorporated herein by reference.

FIELD OF THE INVENTION

The present invention relates to a method for forming a layer of an electrically conductive material filling a plurality of spaced apart recesses formed in the surface of a substrate, wherein the exposed upper surface of the layer is substantially coplanar with non-recessed areas of the substrate surface. More particularly, the invention relates to a method for performing "back-end" metallization of semiconductor high-speed integrated circuit devices having submicron design features and high conductivity interconnect features, which method facilitates planarization of the metallized surface by chemical-mechanical polishing (CMP), increases manufacturing throughput, and improves product quality.

BACKGROUND OF THE INVENTION

The present invention relates to a method for forming metal films as part of metallization processing of particular utility in integrated circuit semiconductor device and circuit board manufacture, and is especially adapted for use in processing employing "damascene" (or "in-laid") technology.

The escalating requirements for high density and performance associated with ultra large scale integration (ULSI) semiconductor device wiring are difficult to satisfy in terms of providing submicron-sized (e.g., 0.18 μm), low RC time constant metallization patterns, particularly wherein the submicron-sized metallization features such as vias, contact areas, grooves, trenches, etc., have high aspect (i.e., depth-to-width) ratios due to microminiaturization.

Semiconductor devices of the type contemplated herein typically comprise a semiconductor wafer substrate, usually of doped monocrystalline silicon, and a plurality of sequentially formed dielectric interlayers and conductive patterns formed therein and/or therebetween. An integrated circuit is formed therefrom containing a plurality of patterns of conductive lines separated by interwiring spacings, and a plurality of interconnect lines, such as bus lines, bit lines, word lines, and logic interconnect lines. Typically, the conductive patterns of vertically spaced apart metallization layers are electrically connected by a vertically oriented conductive plug filling a via hole formed in the dielectric layer separating the layers, while another conductive plug filling a contact area hole establishes electrical contact with an active region, such as a source/drain region, formed in or on the semiconductor substrate. Conductive lines formed in groove or trench-like openings in overlying dielectric layers extend substantially parallel to the semiconductor substrate. Semiconductor devices of such type fabricated according to current technology may comprise five or more levels of such metallization in order to satisfy device geometry and miniaturization requirements.

Electrically conductive films or layers of the type contemplated herein for use in e.g., "back-end" semiconductor manufacturing technology as required for fabrication of devices as above described typically comprise a metal such as titanium, tantalum, tungsten, aluminum, chromium, nickel, cobalt, silver, gold, copper, and their alloys. In use, each of the recited metals presents advantages as well as drawbacks. For example, aluminum (Al) is relatively inexpensive, exhibits low resistivity, and is relatively easy to etch. However, in addition to being difficult to deposit by lower cost, lower temperature, more rapid "wet" technology such as electrodeposition, step coverage with aluminum is poor when the metallization features are scaled down to submicron size, resulting in decreased reliability of interconnections, high current densities at certain locations, and increased electromigration. In addition, low dielectric constant materials, e.g., polyamides, when employed as dielectric interlayers, create moisture/bias reliability problems when in contact with aluminum.

The use of via plugs filled with tungsten (W) may alleviate several problems associated with aluminum. However, most W-based processes are complex and expensive. In addition, the high resistivity of W may cause Joule heating which can undesirably enhance electromigration of aluminum in adjacent wiring. Moreover, W plugs are susceptible to void formation and high contact resistance at the interface with the aluminum wiring layer.

Copper (Cu) and Cu-based alloys are particularly attractive for use in large-scale integration (LSI), very large-scale integration (VLSI), and ultra large-scale integration (ULSI) devices requiring multilevel metallization systems for "back-end" processing of the semiconductor wafers on which the devices are based. Cu and Cu-based metallization systems have very low resistivities, i.e., significantly lower than that of W and even lower than those of previously preferred systems utilizing aluminum and its alloys, as well as significantly higher resistance to electromigration. Moreover, Copper and its alloys enjoy a considerable cost advantage over a number of the above-enumerated metals, notably silver and gold. Also, in contrast to aluminum and the refractory-type metals, copper and its alloys can be readily deposited at low temperatures in good quality, bright layer form by well known electroplating techniques, at deposition rates fully compatible with the requirements of device manufacturing throughput.

In addition to convenient, relatively low cost, low temperature, high throughput "wet" deposition by electroplating, copper and its alloys are readily amenable to low cost, high throughput electroless deposition of high quality films for efficiently filling recesses such as vias, contact areas, and grooves and trenches forming interconnection routing. Such electroless plating generally involves the controlled autocatalytic deposition of a continuous film of copper or an alloy thereof on a catalytic surface by the interaction in solution containing at least a copper salt and a chemical reducing agent, whereas electroplating comprises employing electrons supplied to an electrode from an external source (i.e., a power supply) for reducing copper ions in solution and depositing reduced metal atoms on the surface thereof. In either case, a nucleation/seed layer is required for catalysis and/or deposition on the types of substrates contemplated for use herein. Finally, while electroplating requires a continuous nucleation/seed layer, very thin and discontinuous islands of a catalytic metal may be employed with electroless plating.

As indicated above, a commonly employed method for forming "in-laid" metallization patterns such as are required for "back-end" metallization processing of semiconductor wafers employs "damascene" type technology. Generally, in such processing methodology, a recess (i.e., an opening) for forming, e.g., a via hole in a dielectric interlayer for electrically connecting vertically separated metallization layers, is created in the dielectric interlayer by conventional photolithographic and etching techniques, and filled with a metal plug, typically of tungsten. Any excess conductive material (i.e., tungsten) on the surface of the dielectric interlayer is then removed by, e.g., chemical-mechanical polishing techniques (CMP), wherein a moving pad is biased against the surface to be polished, with the interposition of a slurry containing abrasive particles (and other ingredients) therebetween.

A variant of the above-described technique, termed "dual damascene" processing, involves the formation of an opening comprising a lower contact or via hole section in communication with an upper groove or trench section, which opening is filled with a conductive material, typically a metal, to simultaneously form a conductive plug in electrical contact with a conductive line.

Figure 1:
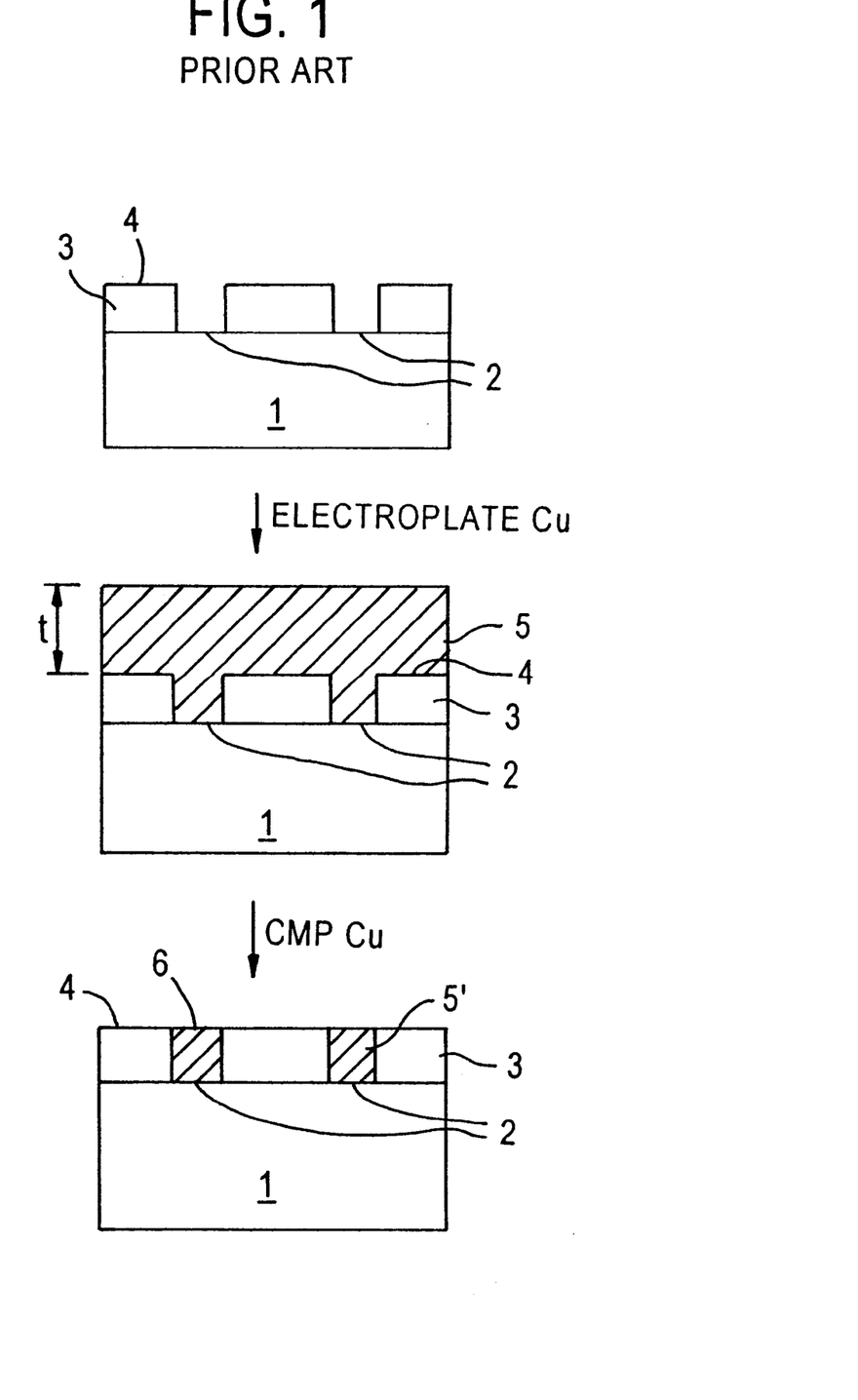
FIG. 1 illustrates, in simplified, cross-sectional schematic form, a sequence of steps for performing a damascene type copper electroplating and CMP process according to conventional practices.

Referring now to FIG. 1, schematically shown therein in simplified cross-sectional view is a conventional damascene processing sequence employing relatively low cost, high manufacturing throughput electroplating and CMP techniques for forming recessed "back-end" metallization patterns (illustratively of copper-based metallurgy but not limited thereto) in a semiconductor device formed in or on a semiconductor wafer substrate 1. In a first step, the desired arrangement of conductors is defined as a pattern of recesses 2 such as holes, grooves, trenches, etc., formed (as by conventional photolithographic and etching techniques) in the surface 4 of a dielectric layer 3 (e.g., a silicon oxide and/or nitride or an organic polymeric material) deposited or otherwise formed over the semiconductor substrate 1. In a second step, a layer of copper or copper-based alloy 5 is deposited by conventional electroplating techniques to fill the recesses 2. In order to ensure complete filling of the recesses, the copper-containing layer is deposited as a blanket (or "overburden") layer of excess thickness t so as to overfill the recesses 2 and cover the upper surface 4 of the dielectric layer 3. Next, the entire excess thickness t of the metal overburden layer 5 over the surface 4 of the dielectric layer 3 is removed by a CMP process utilizing an alumina-based slurry, leaving metal portions 5' in the recesses 2 with their exposed upper surfaces 6 substantially coplanar with the surface 4 of the dielectric layer 3.

The above-described conventional damascene process forms in-laid conductors 5' in the dielectric layer 3 while avoiding problems associated with other types of metallization patterning processing, e.g., blanket metal layer deposition, followed by photolithographic masking/etching and dielectric gap filling. In addition, such single or dual damascene-type processing can be performed with a variety of other types of substrates, e.g., printed circuit boards, with and/or without intervening dielectric layers, and with a plurity of metallization levels, i.e., five or more levels.

However, the use of electroplated metallization as described above has presented a number of problems, particularly, but not exclusively, with the use of copper-based metallurgy. For example, although electroplating of copper (a "wet" technique) has advantages over "dry" techniques (e.g., physical or chemical vapor deposition), such as rapid rates of deposition at low temperatures and good compatibility with "wet" CMP processing, it suffers from a drawback of ridge build-up over sharp corners of vias, grooves, and trenches. Thus, in conventional practices utilizing electrolytic deposition of copper or copper-based conductors, a rather thick blanket or overburden layer 5, typically about 0.5–1.5 $\mu$m thick, must be deposited over the recess-patterned surface to ensure complete filling (i.e., overfilling) of recesses 2 such as via holes, trenches, grooves, and other variously configured openings. Moreover, the resulting surface after overfilling may be highly non-planar, with the layer thicknesses thereof spanning the entire range of thicknesses given above.

Removal of such thick, non-planar blanket layers of copper-based material in the subsequent CMP step for planarizing the interconnection metallization entails a number of disadvantages. For example, removal of the excess copper-based material by CMP is slow and expensive. Specifically, typical copper or copper alloy removal rates by CMP employing a conventional alumina-based slurry are on the order of about 2,000–3,000 Å/min. Consequently, removal of 0.5–1.5 $\mu$m thick copper-based layers can require long processing times extending up to about 5 minutes, considerably longer than that desired for good manufacturing throughput and reduced expense. In addition, removal of such thick as-deposited copper or copper-based blanket or overburden layers by CMP results in less uniform polished layers as are obtained when CMP is performed on thinner deposited layers. Such poor uniformity is generally accompanied by an increase in defects such as non-planarity ("dishing") and gouging ("erosion") between adjacent metallization lines.

A further drawback associated with copper-based "back-end" metallization is the possibility of copper diffusion into the underlying semiconductor, typically silicon, resulting in degradation of the semiconductive properties thereof, as well as poor adhesion of the deposited copper or copper alloy layer to various materials employed as dielectric interlayers, etc. As a consequence of these phenomena associated with copper-based metallurgy, it is generally necessary to provide an adhesion promoting and/or diffusion barrier layer intermediate the semiconductor substrate and the overlying copper-based metallization layer. Suitable materials for such adhesion/barrier layers include, e.g., chromium, tantalum, and tantalum nitride.

Figure 2A:
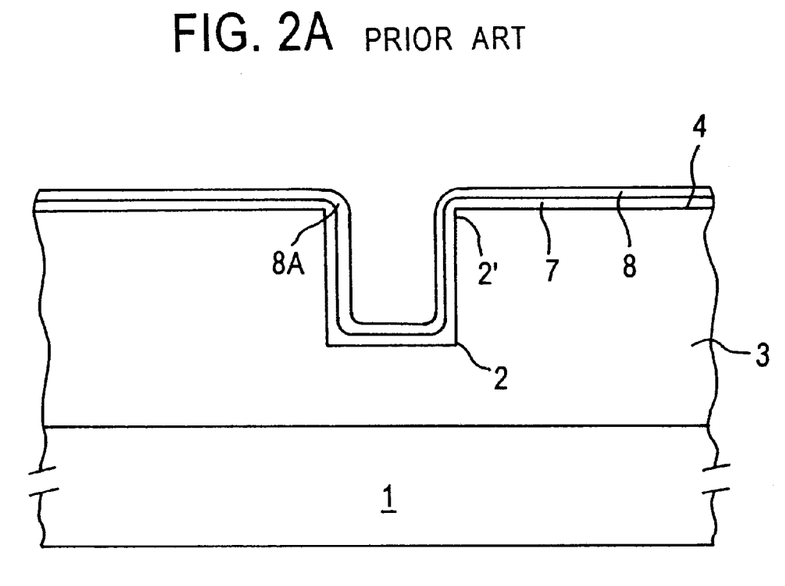
FIGS. 2A–2B and 3A–3B each illustrate, in simplified, cross-sectional schematic form, sequential phases of an electroplating step comprising part of a damascene type metallization process.

Yet another drawback associated with the use of electroplated copper or copper-based damascene type metallization arises from incomplete filling of the recesses during the electroplating process, resulting in void and/or other defect formation causing a reduction in device quality. Referring now to FIGS. 2A–2B and 3A–3B, wherein like reference numerals are employed as previously to designate like features, illustrated therein are simplified schematic cross-sectional views showing sequential phases of the filling of a damascene type recess 2 formed in a dielectric layer 3 overlying a semiconductor wafer substrate 1, typically monocrystalline silicon, with an electroplated metal layer 5, e.g., of copper or an alloy thereof. Referring more particularly to FIG. 2A, as illustrated therein, a thin adhesion/barrier layer 7 of chromium, tantalum, or tantalum nitride and an overlying thin nucleation/seed layer 8 of refractory metal, copper, or copper-based alloy have been sequentially deposited in conventional thicknesses (by conventional techniques such as PVD, CVD, and PECVD) over the surfaces of the dielectric layer exposed within recess 2 and the non-recessed surface 4.

Figure 2B:
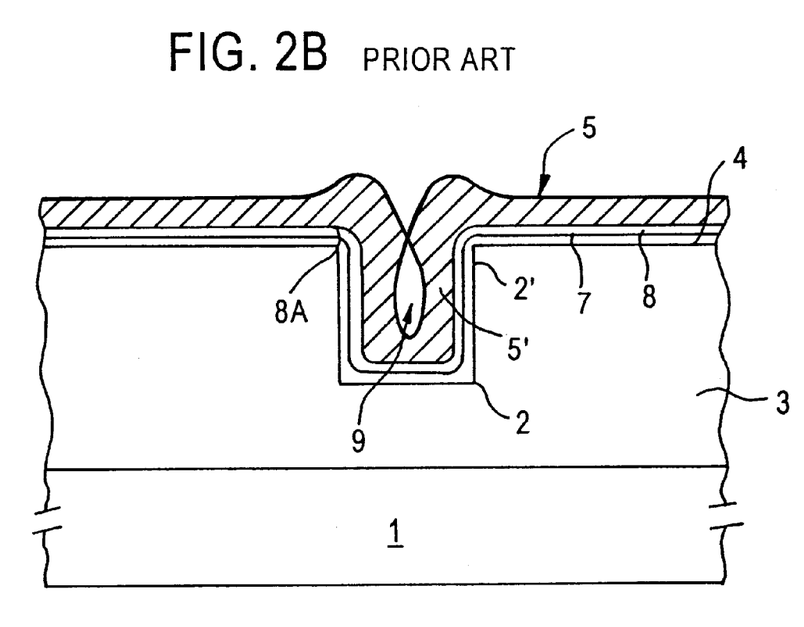

Referring now to FIG. 2B, shown therein is a typical "after-plating" view of recess 2, illustrating formation of an unfilled region 9 in the copper or copper alloy plug portion 5' of metallization layer 5, which unfilled region constitutes an undesirable void or defect resulting in lowered device quality and performance characteristics. While the exact mechanism of such occlusion or "pinching-off", of recess 2 at the upper, or mouth portion 2', thereof is not known with certainty, it is believed to result from increased rates of copper electroplating at the corners of the nucleation/seed layer 8, e.g., at portions indicated by reference numeral 8A. It is further believed that such increased rates of deposition at corners 8A are related to the formation of higher electric fields at such corners during application of the electrical potentials necessary for effecting electroplating thereon.

Figure 3A:
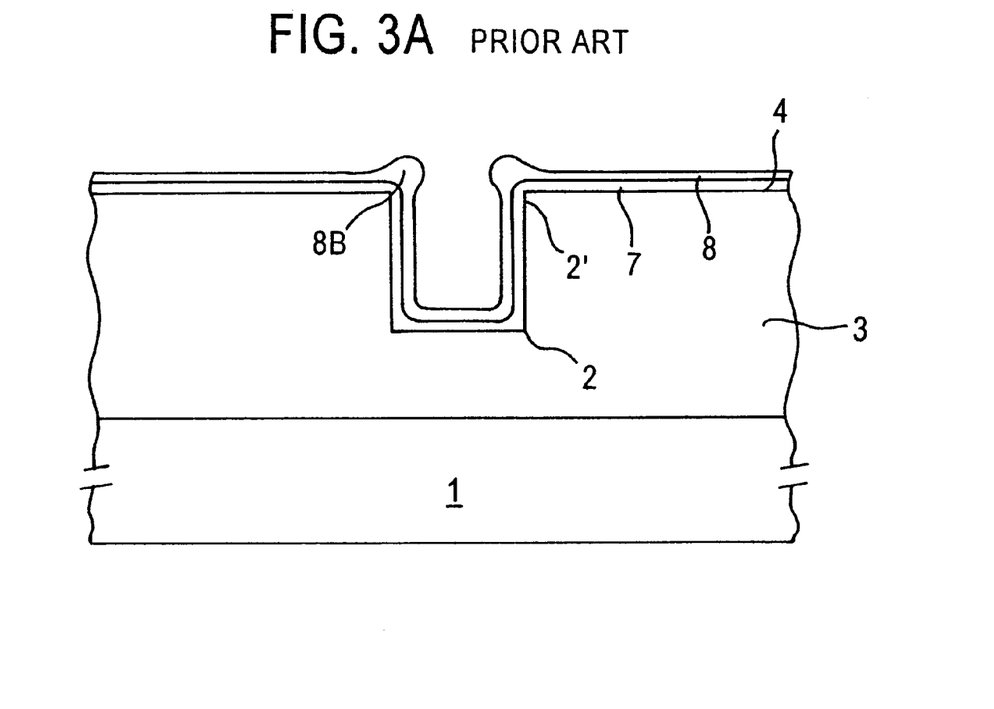
Figure 3B:
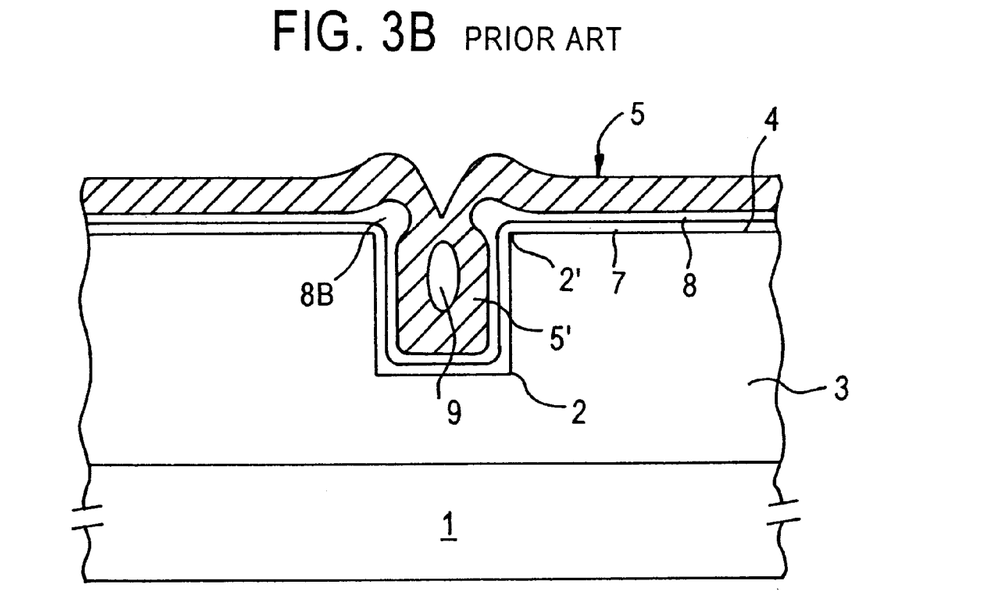

The problem of recess occlusion or "pinching-off" during filling by copper electroplating is further exacerbated, when, as is illustrated in FIGS. 3A–3B analogous to FIGS. 2A–2B, the corners of the nucleation/seed layer 8 include overhanging portions 8B which are frequently formed as a result of conventional processing techniques (PVD, CVD, etc.) for forming same. Such overhang formation further constricts the opening dimension of the recess 2 at the mouth portion 2' thereof and consequently increases the likelihood of "pinch-off" and concomitant void 9 formation.

As design rules for LSI, VLSI, and ULSI semiconductor devices extend further into the submicron range, e.g., about 0.18 $\mu$m and below, and the number of metallization levels increases, the reliability of the metallization/interconnect pattern becomes increasingly critical. Accordingly, the problem of "pinchng-off", or occlusion of recess openings during metal (e.g., copper or copper-based) filling thereof by electroplating requires amelioration.

Thus there exists a need for metallization process methodology enabling the formation of metal contact and interconnect members, particularly of copper or copper-based alloys, having high reliability, high yield, and high performance. In particular, there exists a need for eliminating the problem of void formation in metal recess-filling plugs which results when recesses are filled by conventional electroplating techniques.

The present invention addresses and solves the problems attendant upon conventional processes for manufacturing semiconductor devices utilizing electroplated copper metallization, particularly in the formation of in-laid "back-end" contacts/metallization patterns by damascene techniques employing electroplating and CMP for obtaining good manufacturing throughput and product quality.

DISCLOSURE OF THE INVENTION

An advantage of the present invention is a method of manufacturing a device with a highly reliable metallization pattern at lower cost and with higher manufacturing throughput than obtainable with conventional process methodology.

Another advantage of the present invention is a method of manufacturing an integrated circuit device utilizing copper-based "back-end" contacts and interconnections by a damascene process, with formation of highly reliable copper or copper alloy interconnect members having reduced incidence of defects such as voids therein.

Still another advantage of the present invention is a method for forming in-laid contacts and metallization patterns by electroplating and CMP techniques at an increased speed, lower cost, and with greater uniformity, planarity, and reliability than with conventional electroplating and CMP-based processes.

A further advantage of the present invention is an improved method for forming in-laid contacts and metallization patterns by a damascene-type electroplating and CMP-based process which is fully compatible with existing process methodology.

Additional advantages and other features of the present invention will be set forth in the description which follows and in part will become apparent to those having ordinary skill in the art upon examination of the following or may be learned from practice of the present invention. The advantages of the present invention may be realized and obtained as particularly pointed out in the appended claims.

According to one aspect of the present invention, the foregoing and other advantages are achieved in part by a method of forming a layer of an electrically conductive material filling at least one recess formed in a substrate surface, which method comprises the sequential steps of:

providing a substrate having a surface comprising at least one recess formed therein, the recess comprising:
  (a) a mouth surface portion at the upper end thereof and bordering an adjacent, non-recessed substrate surface portion;
  (b) an interior wall surface portion; and
  (c) a bottom surface portion at the lower end thereof;

providing an electrically conductive nucleation/seed layer over recess surface portions (a), (b), and (c), and extending over the adjacent, non-recessed substrate surface portion;

selectively rendering non-conductive exposed surfaces of the nucleation/seed layer formed over recess portion (a) and the adjacent, non-recessed substrate surface portion; and filling the recess with a layer of an electrically conductive material by electroplating the layer on the nucleation/seed layer over recess surface portions (b) and (c), with no electroplating occurring on the surfaces of the nucleation/seed layer over recess surface portion (a) and the adjacent, non-recessed substrate surface portion rendered non-conductive;

whereby occlusion and/or pinching off of the recess mouth portion during the electroplating due to formation thereon of overhanging portions of the conductive material layer is prevented and unnecessary electroplating on non-recessed portions of the substrate surface is minimized.

In embodiments according to the invention, the substrate comprises a semiconductor wafer having a dielectric layer formed thereon and comprising the surface, the at least one recess formed therein comprises a plurality of recesses of different widths and/or depths for providing electrical contact areas, vias, interlevel metallization and/or interconnection routing of at least one active device region or component of the semiconductor wafer.

In other embodiments according to the present invention, the semiconductor wafer comprises monocrystalline silicon or gallium arsenide having integrated circuitry formed therein or thereon, the dielectric layer comprises an oxide and/or nitride of silicon or an organic polymeric material, the method further comprising planarizing the recess-filled surface by chemical-mechanical polishing (CMP).

In still other embodiments according to the present invention, the exposed surfaces of the nucleation/seed layer over recess surface portion (a) are selectively rendered non-conductive by (1) selective deposition thereon of a layer of an insulative material, as by use of a directed beam process, or (2) selective conversion into an insulative material, as by a directed oxidation process.

In further embodiments according to the present invention, the layer of electroplated electrically conductive material comprises a metal selected from the group consisting of copper, chromium, nickel, cobalt, gold, silver, aluminum, tungsten, titanium, tantalum, and alloys thereof, preferably copper or an alloy thereof, the nucleation/seed layer comprises a refractory metal, copper, or an alloy thereof, at least recess surface portions (a), (b), and (c) are provided with an adhesion promoting and/or diffusion barrier layer comprising chromium, tantalum, or tantalum nitride prior to providing the nucleation/seed layer thereon, and the copper or copper alloy recess-filled, metallized surface is planarized by CMP utilizing an alumina-based slurry.

Another aspect of the present invention is a method of manufacturing a semiconductor device, which method comprises the sequential steps of:

providing a substrate comprising a semiconductor wafer having thereon a dielectric layer with a surface comprising a plurality of spaced apart recesses formed therein, with non-recessed areas therebetween, each recess comprising:
  (a) a mouth surface portion at the upper end thereof and bordering the adjacent, non-recessed substrate surface area;
  (b) an interior wall surface portion; and
  (c) a bottom surface portion at the lower end thereof;
providing an electrically conductive nucleation/seed layer formed over at least each of said recess surface portions (a), (b), and (c) and extending over the respective adjacent, non-recessed substrate surface area;
selectively rendering non-conductive exposed surfaces of the nucleation/seed layer formed over each surface portion (a)and respective adjacent, non-recessed substrate surface area; and
filling each recess with a layer of electrically conductive material by electroplating the layer on the nucleation/seed layer over respective recess surface portions (b) and (c), with no electroplating occurring on the surfaces of the nucleation/seed layer over recess surface portions (a) and respective adjacent, non-recessed substrate surface areas rendered non-conductive;
whereby occlusion and/or pinching off of the recess mouth portions (a) during electroplating due to formation thereon of overhanging portions of the conductive material layer is prevented and unnecessary electroplating on the respective non-recessed portions of the substrate surface is minimized.

According to yet another aspect according to the present invention, integrated circuit semiconductor devices comprising in-laid, "back-end" metallization patterns including recess mouth surface portions selectively rendered insulative according to the inventive method, are provided.

Additional advantages of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the embodiment of the present invention can best be understood when read in conjunction with the following drawings, wherein.

DESCRIPTION OF THE INVENTION

The present invention addresses and solves problems arising from manufacturing semiconductor devices comprising in-laid, "back-end" metallization patterns, wherein, as part of the fabrication methodology, a plurality of recesses formed in the surface of a dielectric layer overlying a semiconductor substrate are filled with a metal, e.g., copper or copper alloy, by an electroplating process. More specifically, the present invention advantageously enables the complete (i.e., voidless) filling of openings in a dielectric layer, such as damascene openings in a silicon oxide layer, while preventing occlusion and/or "pinching-off", of the openings while the openings are filled during an electroplating process. In addition, the present invention advantageously minimizes electroplating on non-recessed areas of the dielectric layer, thereby reducing the interval and cost required for planarization by CMP.

The present invention enables the formation of a metal, e.g., copper or copper alloy, contact and interconnect pattern with completely and uniformly filled openings, thereby enhancing product reliability and performance. Briefly stated, according to the present invention, the portions of an electrically conductive nucleation/seed layer (required for electrodeposition thereon) formed over mouth surface portions of recesses in the dielectric layer are selectively rendered non-conductive. As a consequence, electroplating thereon which disadvantageously results in formation of overhanging portions which eventually coalesce and cause occlusion or "pinching-off", of the openings at the mouths of the recesses, is effectively prevented.

Copper and/or copper alloy interconnect members formed in accordance with embodiments of the present invention can be, but are not limited to, interconnects formed by damascene technology. Thus, embodiments of the present invention include providing a substrate (e.g., a semiconductor wafer) having a dielectric layer thereon with a plurality of recesses (i.e., damascene openings) formed in its exposed, upper surface; successively depositing a thin, electrically conductive adhesion promoting/diffusion barrier layer (e.g., TaN) and a thin, electrically conductive nucleation/seed layer (e.g., Cu or Cu alloy) lining the surfaces of the recesses and atop the non-recessed surfaces intermediate the recesses; selectively rendering non-conductive the portions of the nucleation/seed layer at the mouth portions at the upper ends of the recesses and in the non-recessed surface portions intermediate the recesses; voidlessly filling the recesses with metal (e.g., copper or copper alloy) by electroplating; and planarizing the resultant upper surface by CMP.

Given the present disclosure and the objectives of the invention, the electroplating parameters can be optimized for use in particular situations. For example, it was found suitable to employ a conventional $CuSO_4$ based bright copper plating bath (e.g., such as Enthone "M", available from Enthone OMI, New Haven, Conn.) at current densities of about 10 to about 30 $mA/cm^2$ and bath temperatures of about 15 to about 35° C. The substrate can be doped monocrystalline silicon or gallium arsenide. The dielectric layer(s) can comprise any of those conventionally employed in the manufacture of integrated circuit semiconductor devices, e.g., silicon oxides, silicon nitrides, silicon oxynitrides, phosphosilicate glass (PSG), borophosphosilicate glass (BPSG), silicon oxides derived from plasma decomposition of organic materials (e.g., TEOS) or silanes, and low dielectric constant organic polymeric materials.

Figure 4:
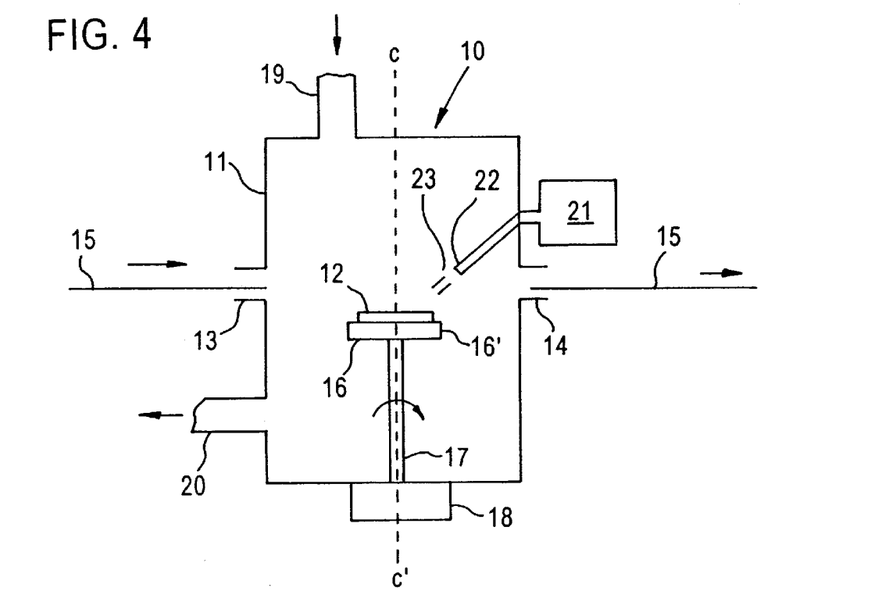
FIG. 4 illustrates, in simplified, cross-sectional form, an apparatus for selectively rendering electrically non-conductive the portions of a nucleation/seed layer formed over mouth surface portions (a) of recesses formed in the surface of a workpiece and adjacent non-recessed surface area portions.
Figure 5:
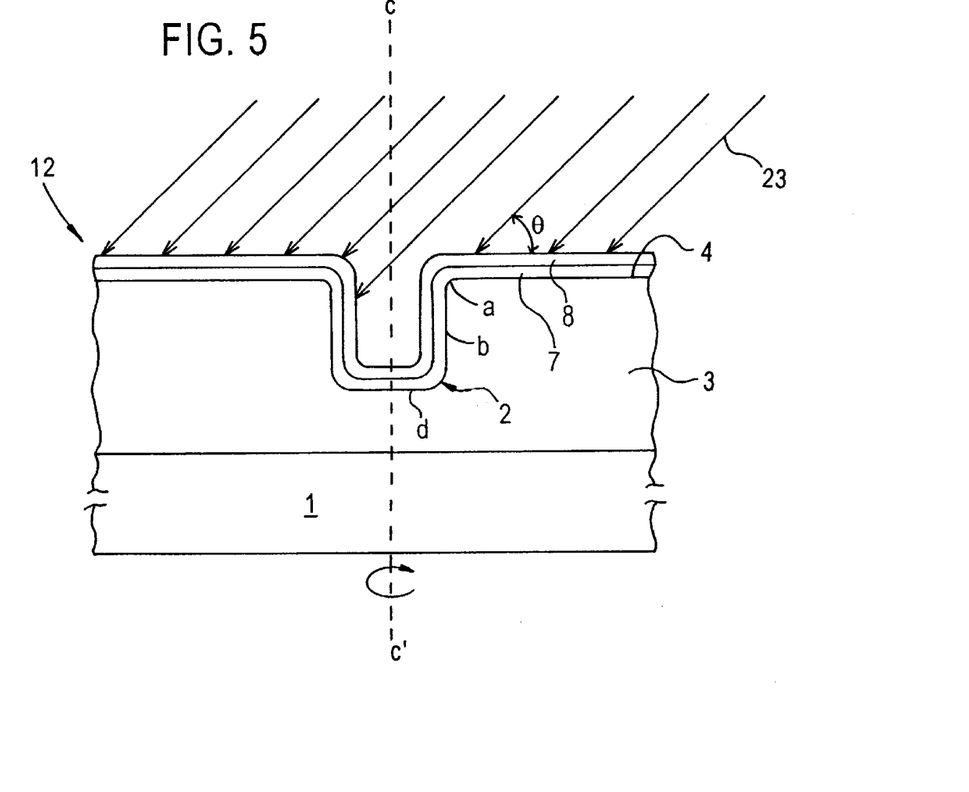
FIG. 5, illustrates, in simplified, cross-sectional form, an enlarged view of a portion of a workpiece during treatment in the apparatus of FIG. 4 for selectively rendering recess mouth surface and non-recessed surface area portions of the nucleation/seed layer electrically non-conductive.

An embodiment of the present invention will now be described with reference to FIGS. 4–7. Referring initially to FIGS. 4–5, schematically shown in FIG. 4 is a cross-sectional view of an illustrative, but non-limitative, generic apparatus 10 suitable for use in treating wafer-shaped workpieces 12, such as shown in FIG. 5, according to the method of the invention. Inasmuch as wafer-shaped workpiece 12 corresponds to that shown and described with reference to FIG. 3A, a detailed description thereof will not be given here. Suffice it to say, recess 2 formed in dielectric layer 3 atop semiconductor wafer workpiece substrate 1 comprises, for purposes of the following discussion, a mouth surface portion a at the upper end thereof, an interior wall surface portion b, and a bottom surface portion d at the lower end thereof. As illustrated in FIG. 5, electrically conductive adhesion/barrier layer 7 and nucleation/seed layer 8 are sequentially formed as to cover surface portions a, b, and d of recess 2 and to extend over non-recessed surface portions 4 of dielectric layer 3 such as are present between adjacent recesses.

Returning now to FIG. 4, generic apparatus 10, when adapted for use as part of a continuous manufacturing line, comprises a chamber 11 having entrance and exit apertures 13 and 14, respectively, at opposite sides thereof for receiving and discharging substrates 12 supplied thereto and removed therefrom by a transfer mechanism 15 of conventional design. Chamber 11 includes a heatable support 16 for mounting thereon a wafer substrate, e.g., such as 12 illustrated in FIG. 5. The support 16 is mounted on a rotatable shaft 17 which is coupled to a motor 18 for rotating workpiece 12 about a central axis c–c' perpendicular to the surface of the workpiece. The chamber 11 may also be provided with a gas inlet 19 and gas outlet 20, for respectively supplying a desired gas atmosphere, e.g., an oxidizing atmosphere such as oxygen ($O_2$), a photochemically or plasma reactive atmosphere such as of silane ($SiH_4$) or derivative thereof, or an inert gas such as nitrogen ($N_2$) or argon (Ar), and exhausting the chamber 11 to achieve a desired vacuum level.

Mounted above the workpiece and offset from the axis c–c', preferably beyond the peripheral edge 16' of the workpiece mount 16, is the outlet or nozzle 22 of a device 21, schematically shown in the drawing, for selectively rendering non-conductive the portion of nucleation/seed layer 8 overlying recess mouth surface portion a of recess 2 and the adjacent portions of the nucleation/seed layer 8 overlying non-recessed surface portions 4. As is apparent from FIGS. 4 and 5, nozzle 22 of source device 21 emits a collimated stream 23 (e.g., of solid particles, or vapor comprising atoms, molecules, etc.) or a beam 23 (e.g., of electromagnetic radiation such as photons of given wavelength) directed for impingement of the surface of the workpiece wafer 12 at an acute angle θ thereto.

Source device 21 may either act to selectively convert exposed surfaces of nucleation/seed layer into electrically non-conductive surfaces or selectively deposit a layer of electrically nonconductive material thereon. Accordingly, source device 21 may comprise a variety of sources adapted for such function, including, but not limited to: a plasma source for supplying a stream of a reactive plasma, e.g., of oxygen, for selective oxidation of the recess mouth surface portions a and adjacent non-recessed surface areas; an ion or molecular beam source for similarly supplying oxygen containing ions or molecules for such selective oxidation or for supplying a directed stream of insulative material in molecular form for deposition on the selected surfaces; and a source for supplying a directed beam of superfinely sized particles of a solid oxidizing compound or material, e.g., micropulverized manganese dioxide ($MnO_2$).

Source device 21 may also comprise a source of collimated or directed electromagnetic radiation, e.g., a laser, for selectively effecting photochemical reaction of a precursor gas, e.g., silane ($SiH_4$), or other known dielectric material precursor, supplied to chamber 11 via gas inlet 19, for selective reaction at the desired surface portions of the nucleation/seed layer 8.

Figure 6:
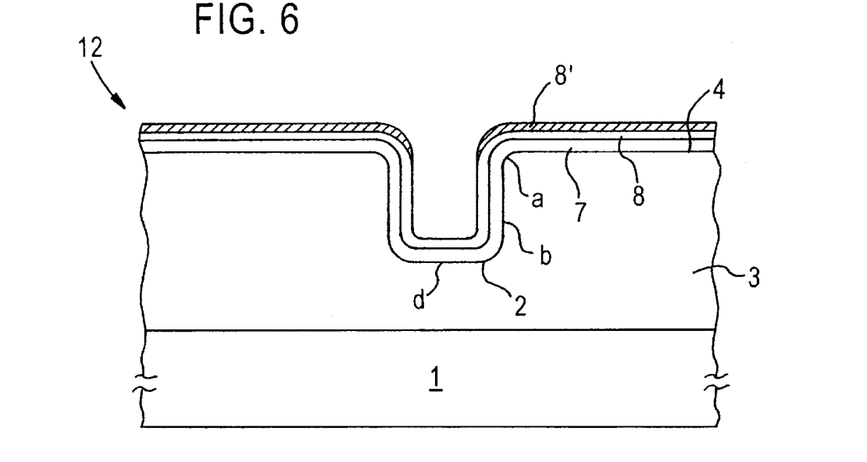
FIG. 6 illustrates, in simplified, cross-sectional form, the portion of the of the workpiece of FIG. 5 after being subjected to treatment by the apparatus of FIG. 4.

As will be appreciated from FIGS. 5 and 6, the combination of the collimated stream or beam 23 directed towards or onto the workpiece surface at an acute angle thereto while rotating the workpiece about central axis c–c' perpendicular to its surface results in selective oxidation or deposition of the nucleation/seed layer 8 overlying the recess mouth surface portion a and the adjacent non-recessed surface area portion 4, while effectively preventing reaction with, or deposition on, recess surface portions b and d. Given the present disclosure and the essential principle of the inventive method, the choice of particular source device 21 and determination of optimum conditions for use in a particular situation are considered within the ambit of one of ordinary skill.

In an alternative embodiment (not illustrated), the particles of manganese dioxide ($MnO_2$) are embedded or otherwise incorporated in a polymeric membrane, and the membrane is urged against the recess-patterned surface of the workpiece wafer while the contacting surfaces are subjected to relative motion, as in chemical-mechanical polishing (CMP) processing. The demobilization of the $MnO_2$ oxidizer particles in the membrane in such arrangement effectively precludes their entry into the interior of the recesses, while the flexible nature of the membrane allows for conformity with the surface curvature at the mouths of the openings, thereby limiting oxidation of the nucleation/seed layer to the recess mouths and non-recessed areas intermediate adjacent recesses.

Referring now to FIG. 6, in a preferred, but non-limitative embodiment, selective oxidation of recess mouth portions of semiconductor wafers having high aspect ratio recesses 2 (i.e., openings having depth-to-width ratios substantially greater than about 1) and adjacent non-recessed portions of a copper or copper alloy nucleation layer is accomplished by exposing the surface of workpiece 12 to a directed, collimated stream of superfine, e.g., micron-sized diameter, micropulverized particles of manganese dioxide ($MnO_2$) emanating from nozzle 23 at a high velocity and at an acute angle to the surface of the wafer. Oxidation of the selected surfaces of the copper nucleation layer occurs for a time sufficient to form an electrically non-conductive copper and oxygen-containing layer 8' in recess mouth surface portion a and non-recessed surface area portion 4, and is enhanced by heating the wafer during treatment by means of heatable workpiece support 16. Motor 18 rotates the support 16 at a high rotational velocity during processing in order to ensure complete treatment of the entire recess mouth surface portion a. After surface oxidation or insulator deposition has occurred to form a non-conductive layer 8' of desired thickness in each region, the workpiece wafer 12 is then subjected to suitable cleaning, rinsing, vacuum treatment, etc., (by means not shown in the figure), for removal of unreacted $MnO_2$ and/or reaction product residue from the surfaces of the wafer, including the recess surfaces.

The thickness of non-conductive layer 8' is not required to be uniform throughout its entire area extent. Specifically, whereas the thickness of the non-conductive layer portion over the recess mouth surface portion a must be sufficient to substantially eliminate electrodeposition thereon during the subsequent recess-filling step, the thickness of the layer portions over the non-recessed areas 4 need only be thick enough to inhibit or partially suppress electrodeposition thereon. This is because any electrodeposit formed thereover will be removed during subsequent CMP processing for planarization, as described below.

According to yet another embodiment according to the present invention, source device 21 comprises a laser of wavelength output selected to photochemically effect selective deposition of an insulator from gaseous reactants supplied to chamber 11 via gas inlet 19, e.g., silane ($SiH_4$) and oxygen ($O_2$) for deposition of silicon dioxide ($SiO_2$).

Figure 7A:
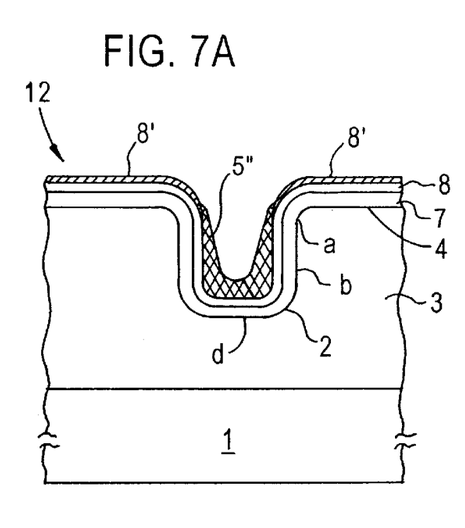
FIGS. 7A–7B, illustrate, in simplified, cross-sectional form, a portion of the workpiece of FIG. 6 after successive stages of electroplating thereon for filling the recess with metal.
Figure 7B:
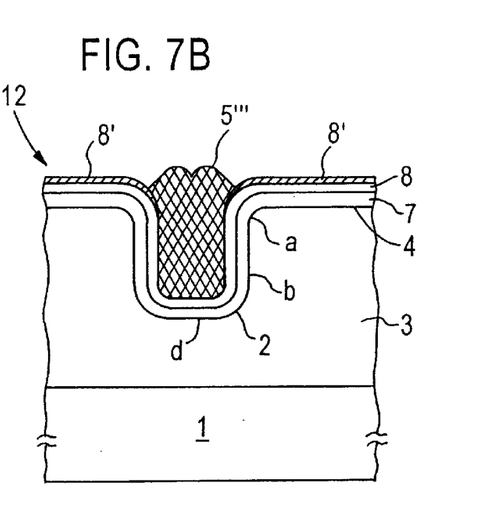

Referring now to FIGS. 7A–7B, shown therein are schematic, partial cross-sectional views illustrating successive stages during metal (e.g., copper) electroplating of the workpiece wafer 12 of FIG. 6, wherein non-conductive layer 8' has been selectively formed over recess mouth surface portion a and non-recessed surface area portions 4. The copper electroplating is conducted essentially in the same manner and under the same operating conditions, parameters, etc., as in conventional electroplating for "back-end" metallization processing of semiconductors, i.e., as previously described. However, in contrast with conventional electroplating of recessed areas, deposition at the recess mouth surface portion a is substantially prevented by the presence of non-conductive layer portion 8' thereat, resulting in commencement of formation of partial metal (i.e., copper) plug 5" on interior wall and bottom surfaces b and d, respectively (FIG. 7A). In addition, electrodeposition of copper over the non-recessed surface portions 4 is minimized, if not substantially prevented by the non-conductive layer 8'. FIG. 7B shows the state after further electroplating, illustrating formation of a voidless metal plug 5''' substantially completely filling recess 2 and extending slightly above the wafer's back surface. As in the earlier stage shown in FIG. 7A, non-recessed surface area portions are substantially free of electroplated copper.

In a subsequent step, not illustrated, the thus-electroplated wafer is subjected to a process for planarizing the plated surface, as by conventional chemical-mechanical-polishing (CMP) utilizing an alumina-based slurry, similarly to the last step illustrated in FIG. 1.

Thus, the present invention enables the formation of extremely reliable interconnect members and patterns, e.g., of copper or copper alloy, by providing a method for voidless filling of recesses while concomitantly reducing the amount of copper metal to be removed during subsequent planarization, as by CMP. The inventive process thereby effects a substantial reduction in time and cost of "back-end" damascene-type processing for forming in-laid metallization patterns. In addition, the inventive method is equally applicable for use in dual-damascene type processing.

The present invention is applicable to the formation of various types of in-laid metallization patterns, illustratively, but not limited to, copper and/or copper alloys. The present invention is particularly applicable to the manufacture of semiconductor devices having submicron metallization features and high aspect ratio openings. The invention is also particularly well suited to the manufacture of circuit boards and other types of electronic devices and/or components.

In the previous description, numerous specific details are set forth, such as specific materials, structures, reactants, processes, etc., in order to provide a better understanding of the present invention. However, the present invention can be practiced without resorting to the details specifically set forth. In other instances, well known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of forming a layer of an electrically conductive material filling at least one recess formed in a substrate surface, which method comprises the sequential steps of:

provding a substrate having a surface comprising at least one recess formed therein, said recess comprising:
(a) a mouth surface portion at the upper end thereof and bordering an adjacent, non-recessed substrate surface portion;
(b) an interior wall surface portion; and
(c) a bottom surface portion at the lower end thereof;

providing an electrically conductive nucleation/seed layer over recess surface portions (a), (b), (c), and extending over the adjacent, non-recessed substrate surface portion;

selectively rendering non-conductive exposed surfaces of said nucleation/seed layer formed over recess surface portion (a) and adjacent, non-recessed substrate surface portion; and filling said recess with a layer of an electrically conductive material by electroplating said layer on the nucleation/seed layer over recess surface portions (b) and (c), with substantially no electroplating occurring on the surfaces of said nucleation/seed layer over said recess surface portion (a) and said adjacent, non-recessed substrate surface portion rendered non-conductive;

whereby occlusion and/or pinching off of the recess mouth portion (a) during said electroplating due to formation thereon of overhanging portions of said conductive material layer is prevented and unnecessary electroplating on non-recessed portions of the substrate surface is minimized.

2. The method as in claim 1, comprising providing a semiconductor wafer substrate having a dielectric layer formed thereon and comprising said surface, and said at least one recess formed therein comprises a plurality of recesses of different widths and/or depths for providing electrical contact areas, vias, interlevel metallization, and/or interconnection routing of at least one active device region or component of said semiconductor wafer.

3. The method as in claim 2, comprising providing a wafer of monocrystalline silicon or gallium arsenide having integrated circuitry formed therein or thereon, and said dielectric layer comprises an oxide and/or nitride of silicon, or an organic polymeric material.

4. The method as in claim 3, further comprising planarizing the recess-filled surface by chemical-mechanical polishing.

5. The method as in claim 3, comprising selectively rendering non-conductive exposed surfaces of said nucleation/seed layer over recess surface portion (a) by selective deposition thereon of a layer of an insulative material or by selective conversion of said exposed nucleation/seed layer surfaces into an insulative material.

6. The method as in claim 5, comprising selectively depositing said insulative material layer on said nucleation/seed layer surfaces by a directed beam process.

7. The method as in claim 5, comprising selectively converting said nucleation/seed layer surfaces into said insulative material by a directed oxidation process.

8. The method as in claim 3, comprising electroplating a layer of an electrically conductive material comprising a metal selected from the group consisting of copper, chromium, nickel, cobalt, gold, silver, aluminum, tungsten, titanium, tantalum, and alloys thereof.

9. The method as in claim 8, comprising electroplating a layer of copper or a copper-based alloy.

10. The method as in claim 9, further comprising providing at least said recess surface portions (a), (b), and (c) with an adhesion promoting and/or diffusion barrier layer prior to providing said nucleation/seed layer thereon.

11. The method as in claim 10, comprising providing said adhesion/barrier layer as a material selected from the group consisting of chromium, tantalum, and tantalum nitride.

12. The method as in claim 9, comprising providing said nucleation/seed layer by a physical or chemical vapor deposition process, wherein said nucleation/seed layer is a material selected from the group consisting of refractory metals, copper, and copper-based alloys.

13. A method of manufacturing a semiconductor device, which method comprises the sequential steps of:
   providing a substrate comprising a semiconductor wafer having thereon a dielectric layer with a surface comprising a plurality of spaced apart recesses formed therein, with non-recessed substrate surface areas therebetween, wherein each said recess comprises:
   (a) a mouth surface portion at the upper end thereof and bordering the adjacent, non-recessed substrate surface area;
   (b) an interior wall surface portion; and
   (c) a bottom surface portion at the lower end thereof;
   providing an electrically conductive nucleation/seed layer over each of said recess surface portions (a), (b), (c) and extending over the respective adjacent, non-recessed substrate surface area;
   selectively rendering non-conductive exposed surfaces of the nucleation/seed layer formed over each recess surface portion (a) and respective adjacent, non-recessed substrate surface area; and
   filling each recess with a layer of electrically conductive material by electroplating said layer on the nucleation/seed layer over respective recess surface portions (b) and (c), with no electroplating occurring on the surfaces of said nucleation/seed layer over recess surface portions (a) and respective adjacent, non-recessed substrate surface areas rendered non-conductive;
   whereby occlusion and/or pinching-off of the recess mouth portions (a) during said electroplating due to formation thereon of overhanging portions of said conductive material layer is prevented and unnecessary electroplating on said non-recessed portions of the substrate surface is minimized.

14. The method as in claim 13, comprising providing a wafer of monocrystalline silicon or gallium arsenide having integrated circuitry formed therein or thereon; said dielectric layer comprises an oxide and/or nitride of silicon or an organic polymeric material; said plurality of recesses formed therein are of different widths and/or depths for providing electrical contact areas, vias, interlevel metallization, and/or interconnection routing of said integrated circuitry; said nucleation/seed layer comprises a refractory metal, copper, or a copper-based alloy; and said layer of electrically conductive material comprises copper or a copper-based alloy.

15. The method as in claim 14, further comprising planarizing the copper or copper-based base alloy-filled recesses by chemical-mechanical polishing utilizing an alumina-based slurry.

16. The method as in claim 15, comprising selectively rendering non-conductive exposed surfaces of said nucleation/seed layer over recess surface portions (a) by selective deposition thereon of a layer of an insulative material or by selective conversion of said exposed nucleation/seed layer surfaces into an insulative material.

17. The method as in claim 16, comprising selectively depositing said insulative material by a directed beam process or selectively converting said nucleation/seed layer surfaces by a directed oxidation process.

18. The method as in claim 15, comprising providing said recess surface portions (a), (b), and (c) with an adhesion promoting and/or diffusion barrier layer a material selected from the group consisting of chromium, tantalum, and tantalum nitride prior to providing said nucleation/seed layer thereon.

* * * * *